United States Patent [19]
Castonguay

[11] 3,857,683

[45] Dec. 31, 1974

[54] PRINTED CIRCUIT BOARD MATERIAL INCORPORATING BINARY ALLOYS

[75] Inventor: Richard N. Castonguay, Los Angeles, Calif.

[73] Assignee: The Mica Corporation, Culver City, Calif.

[22] Filed: July 27, 1973

[21] Appl. No.: 383,088

[52] U.S. Cl. .......... 29/195
[51] Int. Cl. .......... B32b 15/04
[58] Field of Search .......... 29/195 P, 195 G, 195 M

[56] References Cited

UNITED STATES PATENTS

| | | | |
|---|---|---|---|
| 3,218,194 | 11/1965 | Maissel | 117/217 |
| 3,493,352 | 2/1970 | Wright et al. | 29/195 P X |
| 3,771,973 | 11/1973 | Miller | 29/195 P |

*Primary Examiner*—C. Lovell
*Assistant Examiner*—E. L. Weise
*Attorney, Agent, or Firm*—Wills, Green & Mueth

[57] ABSTRACT

A novel printed circuit board material in the form of a layered stock comprising an insulating support, at least one layer of electrical resistance material adhering to said support, and a layer of a highly conductive material adhering to the resistance material and in intimate contact therewith, said layer of electrical resistance material being selected from the group consisting of chromium-antimony, chromium-manganese, chromium-phosphorus, chromium-selenium, chromium-tellurium, cobalt-antimony, cobalt-boron, cobalt-germanium, cobalt-indium, cobalt-molybdenum, cobalt-phosphorus, cobalt-rhenium, cobalt-ruthenium, cobalt-tungsten, cobalt-vanadium, iron-vanadium, nickel-antimony, nickel-boron, nickel-chromium, nickel-germanium, nickel-indium, nickel-molybdenum, nickel-phosphorus, nickel-rhenium, nickel-vanadium and palladium-molybdenum.

33 Claims, No Drawings

PRINTED CIRCUIT BOARD MATERIAL INCORPORATING BINARY ALLOYS

BACKGROUND OF THE INVENTION

Various printed circuit board materials are known. In general, a printed circuit board material consists of an insulating support and outer layers of highly conductive material on one or both exterior surfaces. Printed circuits with conductor elements can be made from this stock. Essentially, the method of converting the stock into the desired product comprises the selective removal of unwanted portions of the conductive layers to leave conductive areas having the required electrical properties. The present invention is concerned with printed circuit board materials consisting of an insulating support, one or more layers of resistance material, and one or two layers of highly conductive material. Printed circuits with electrically resistive as well as conductive elements can be made from this stock. Essentially, the method of converting the stock into the desired product comprises the selective removal of unwanted layers to leave areas having the required electrical properties, namely, insulating areas (all layers above the support removed) resistance areas (the conductive layers removed), and conductive areas (no layers removed).

SUMMARY OF THE INVENTION

Briefly, this invention comprehends a novel printed circuit board material in the form of a layered stock comprising an insulating support, at least one layer of electrical resistance material adhering to said support, and a layer of a highly conductive material adhering to the resistance material and in intimate contact therewith, said layer of electrical resistance material being selected from the group consisting of chromium-antimony, chromiummanganese, chromium-phosphorus, chromium-selenium, chromium-tellurium, cobalt-antimony, cobalt-boron, cobalt-germanium cobalt-indium, cobalt-molybdenum, cobalt-phosphorus, cobalt-rhenium, cobalt-ruthenium, cobalt-tungsten, cobalt-vanadium, iron-vanadium, nickel-antimony, nickel-boron, nickel-chromium, nickel-germanium, nickel-indium, nickel-molybdenum, nickel-phosphorus, nickel-rhenium, nickel-vanadium and palladium-molybdenum.

It is an object of this invention to provide a novel printed circuit board material.

In one aspect, it is a specific object to provide a layered printed circuit board material wherein there is improved unique resistive material in the form of chromium-antimony, chromium-manganese, chromium-phosphorus, chromium-selenium, chromium-tellurium, cobalt-antimony, cobalt-boron, cobalt-germanium, cobalt-indium, cobalt-molybdenum, cobalt-phosphorus, cobalt-rhenium, cobalt ruthenium, cobalt-tungsten, cobalt-vanadium, iron-vanadium, nickel-antimony, nickel-boron, nickel-chromium, nickel-germanium, nickel-indium, nickel-molybdenum, nickel-phosphorus, nickel-rhenium, nickel-vanadium and palladium-molybdenum.

These and other objects and advantages of this invention will be apparent from the detailed description which follows.

The resistive materials of this invention are binary alloys, that is, they contain two chemical elements which may be in the form of solid solutions, pure metals, intermetallic compounds, and/or mixtures thereof. These resistive materials may, in general, be further characterized as having a maximum bulk resistivity greater than 100 microhm-centimeters, as being plateable from aqueous solution to reproducibly yield adherent deposits capable of withstanding bonding to the insulating support without loss of physical integrity, as being non-radioactive, as having melting point and crystallographic phase transitions, if any, at temperatures greater than 400°C, as having a temperature coefficient of resistivity less than ± 300 ppm from −65 to + 125°C when properly deposited, as having a diffusion coefficient into alpha phase copper less than $2.89 \times 10^{-22}$ moles per square centimeter per second, as having current versus voltage characteristics typical of presently available resistors, and, as having sufficient chemical resistance to withstand normal use conditions when properly protected by passivation, anodization, overplating or coating with an organic or inorganic layer.

The resistive material is deposited from the bath onto a conductive foil such as copper. In some cases desirable changes in the resistive film may be effected by heating the double layer foil at an elevated temperature in air or in a controlled atmosphere at this point in the process. The double layer foil is then laminated, resistive side at the interface, with one or more plies of fiberglass fabric preimpregnated with an appropriate formulation of curable organic resins. It frequently is desirable to include a layer of highly thermally conductive material in the laminate construction. Its purpose is to provide a heat transfer mechanism for the moderation of electrical heating effects of resistors which will be formed on the laminate surface. Aluminum and copper foils have been found suitable for this purpose. The thermally conductive layer may be laminated to the side opposite the resistive cladding or within the several plies of preimpregnated reinforcement. The lamination process is well-known to those skilled in the art. In some cases desirable changes in the properties of the resistive film may be effected by heating the laminate at an elevated temperature at this point in the process. Following these steps, and at the time of use in printed circuit manufacture, the copper surface is coated with photoresist. This layer of photoresist is then exposed through a photographic negative containing the negative image of the combined resistor and conductor patterns. The exposed resist is developed, and the unexposed portion washed away. The panel with the developed image is then etched in an etchant such as an alkaline etchant or ferric chloride acidified with hydrochloric acid until the bare copper is removed. The panel is then rinsed in water and immersed in an etchant appropriate for the particular alloy until the bare resistive material is removed. Alternatively, the resistive layer may be removed by abrasion with such materials as powdered pumice. The remaining exposed photoresist is stripped off and the panel is coated with a new layer of photoresist. This layer is exposed through a photographic negative containing the negative image of the conductor pattern. The exposed resist is developed, and the unexposed portion washed away. The panel with the developed image is then etched in an appropriate etchant until the bare copper is removed. The panel is then rinsed in water and dried. At this point, the conductive and resistive patterns are individually defined, and in appropriate electrical contact with each other.

The general procedure as detailed here and further in the examples which follow contemplates the use of photographic negatives and negative working resists. It should be noted specifically that other processing materials, well-known to those skilled in the art of printed circuit manufacture, are also suitable. For instance, photographic positives can be used in combination with positive working resists (e.g. PR-102 by General Aniline and Film Corporation). Silk screening techniques can also be used in conjunction with any resist that is not attacked by the etchants.

The composition range is expressed in weight percent as are all the percentages in this patent application. The resistivities are given in microhm-cm. The first value listed is the resistivity at the first composition value. The second resistivity value is the maximum value achieveable within the composition range stated, this resistivity value may not occur at the composition extrema. TCRs are given in parts per million per degree Centigrade, and reflect the change which occurs over the temperature range minus 65° Centrigrade to plus 125° Centigrade. For suitably electrodeposited alloy films bonded to a suitable fiberglass reinforced substrate, the range of TCR values given generally spans the range of values observed, provided the composition of the alloy is within the range stated. In some cases, however, a value outside the range of TCR values given may be observed for very limited composition ranges. The extrema of the TCR values are often not coincident with the maximum and minimum composition values.

Reproducible, uniform, fine grained, adherent thin alloy films deposited over large areas of a conductive foil are essential to the practical use of this invention. Among the variety of plating baths available in the prior art, only a few baths are suitable for producing films with the above-mentioned characteristics over the full composition range specified, a requirement necessary in order to produce a complete product line of resistors. The range of resistors available with one composition of alloy is not adequate for these practical applications. The preferred baths are stated in the following examples.

The range of metal, complex, salt and additive concentrations necessary to produce the full composition range of alloy are given. The interrelationship among the metal and complex concentrations as well as the metal and additive and salt concentrations are well-known to those skilled in the art, as is the variation necessary in the complex, salt and additive concentrations when the metal concentrations are altered in order to produce different alloy compositions in the deposit. The preferred temperature is the lowest temperature in the range given which will cause all the components of the bath to remain in solution. The preferred pH is the mean value of the ranges indicated. The preferred form of electrical energy is voltage and current controlled direct current unless otherwise indicated. The preferred current density is dependent on the alloy composition desired and is obvious to one skilled in the art under the constraints of the other information given. Agitation is used in all the baths. Insoluble anodes are preferred, but soluble anodes of binary alloy or of either metal are suitable. Additives where necessary to the performance of the bath are indicated, but additives such as are commonly used in electroplating may be useful to obtain best results with some systems.

Complexing agents other than, or in addition to, the ones stated such as citrates, tartrates, oxalates, maleates, malonates, glycolates, pyrophosphates, ammonia and boric acid, for both or either of the metals in the bath are suitable in many instances and are obvious to those skilled in the art.

Where the following notation is used: Metal ion (anion), the weight given is for the metal only, and the cation and anion indicated are the preferred species for introducing the metal into the bath. Where the weights given refer to hydrates, the hydrate is explicitly stated in the formula given.

The following examples are presented solely to illustrate the invention and should not be regarded as limiting in any way.

EXAMPLE I

System: Chromium-Antimony
Composition: 13 to 74% antimony
Resistivity: 74 to 526 microhm-cm
TCR: plus 100 to plus 500 ppm/°C

| Plating Techniques: | | |
|---|---|---|
| Chromium trioxide, $CrO_3$ | 100–300 | g/l |
| Potassium antimonate, $K_2SbO_4$ | 13–1300 | g/l |
| Sulfuric acid, $H_2SO_4$ | 0–500 | g/l |
| Current density | 5–50 | amp/dm² |
| Temperature | 20–90 | °C |
| pH | Acid | |

By varying the antimony content in the bath from 4 to 90%, the antimony content in the deposit may be varied from 13 to 74%.

EXAMPLE II

Same as Example I except eliminate $K_2SbO_4$ and add $Sb_2O_5$ 16–1600 g/l

By varying the antimony content in the bath from 4 to 90%, the antimony content in the deposit may be varied from 13 to 74%.

EXAMPLE III

| Plating Techniques: | | |
|---|---|---|
| Chromium (fluorborate), $Cr^{+3}(BF_4^-)$ | 2.6–78 | g/l |
| Antimony (fluoborate), $Sb^{+3}(BF_4^-)$ | 6.1–183 | g/l |
| Fluoboric acid (free), $HBF_4$ | 150–650 | g/l |
| Boric acid, $H_3BO_3$ | 0–50 | g/l |
| Current density | 1–25 | amp/dm² |
| Temperature | 20–80 | °C |
| pH | acid | |

By varying the antimony content in the bath from 7.25 to 98%, the antimony content in the deposit may be varied from 13 to 74%. In some cases, in order to obtain a non-crystalline deposit additives must be used in the bath. Their exact nature depends on the bath composition in use and on the substrate for the deposition.

EXAMPLE IV

System: Chromium-Manganese
Composition: 10 to 80% manganese
Resistivity: 36 to 194 microhm-cm
TCR: plus 150 to plus 50 ppm/°C

| Plating Techniques: | | |
|---|---|---|
| Chromium trioxide, $CrO_3$ | 100–300 | g/l |
| Potassium permanganate, $KMnO_4$ | 8–800 | g/l |
| Sulfuric acid, $H_2SO_4$ | 0–500 | g/l |
| Current density | 5–50 | amp/dm² |

EXAMPLE IV-Continued

| | | |
|---|---|---|
| Temperature | 20-90 | °C |
| PH | acid | |

By varing the manganese content in the bath from 1.75 to 80%, the manganese content in the deposit may be varied from 10 to 80%.

EXAMPLE V

| | | |
|---|---|---|
| Plating Techniques: | | |
| Chromium ammonium sulfate $(NH_4)Cr(SO_4)_2 \cdot 12H_2O$ | 500-700 | g/l |
| Manganese sulfate, $MnSO_4$ | 5-100 | g/l |
| Magnesium sulfate, $MgSO_4$ | 30-70 | g/l |
| Ammonium sulfate, $(NH_4)_2SO_4$ | 40-80 | g/l |
| Ammonium hydroxide, $NH_4OH$ | 40-80 | g/l |
| Current density | 5-50 | amp/dm² |
| Temperature | 20-90 | °C |
| pH | alkaline | |

By varying the manganese content in the bath from 2.5 to 40%, the manganese content in the deposit may be varied from 10 to 50%.

EXAMPLE VI

System: Chromium-Phosphorus
Composition: 6 to 52% phosphorus
Resistivity: 57 to 162 microhm-cm
TCR: minus 75 to plus 50 ppm°C
Plating Techniques:

| | | |
|---|---|---|
| Chromium trioxide, $CrO_3$ | 100-300 | g/l |
| Phosphorous acid, $H_3PO_3$ | 4-400 | g/l |
| Sulfuric acid, $H_2SO_4$ | 0-98 | g/l |
| Current density | 5-50 | amp/dm² |
| Temperature | 20-90 | °C |
| pH | acid | |

EXAMPLE VII

Same as Example VI except eliminate $H_3PO_3$ and add:

| | | | |
|---|---|---|---|
| $H_3PO_4$ | 5-500 | 250 | g/l |

By varying the phosphorus content in Examples VI and VII from 1 to 73%, the phosphorus content in the deposit may be varied from 6 to 52%.

EXAMPLE VIII

System: Chromium-Selenium
Composition: 14 to 65% selenium
Resistivity: 80 to 2300 microhm-cm
TCR: plus 100 to plus 800 ppm/°C
Plating Techniques:

| | | |
|---|---|---|
| Chromium trioxide, $CrO_3$ | 100-300 | g/l |
| Selenic acid, $H_2SeO_4$ | 7.25-725 | g/l |
| Sulfuric acid, $H_2SO_4$ | 0-98 | g/l |
| Current density | 5-50 | amp/dm² |
| Temperature | 20-90 | °C |
| pH | acid | |

By varying the selenium content in the bath from 2.5 to 88%, the selenium content in the deposit may be varied from 14 to 65%.

EXAMPLE IX

System: Chromium-tellurium
Composition: 21 to 75% tellurium
Resistivity: 92 to 420 microhm-cm
TCR: plus 100 to plus 500 ppm/°C
Plating Techniques:

| | | |
|---|---|---|
| Chromium trioxide, $CrO_3$ | 100-300 | g/l |

EXAMPLE IX-Continued

| | | |
|---|---|---|
| Tellurium trioxide, $TeO_3$ | 9-880 | g/l |
| Sulfuric acid, $H_2SO_4$ | 0-500 | g/l |
| Current density | 5-50 | amp/dm² |
| Temperature | 20-90 | °C |
| pH | acid | |

By varying the tellurium content in the bath from 4 to 95%, the tellurium content in the deposit may be varied from 21 to 75%.

EXAMPLE X

Same as Example IX except eliminate $TeO_3$, and add

| | | |
|---|---|---|
| $H_6TeO_6$ | 11-1100 | g/l |

By varying the tellurium content in the bath from 4 to 95%, the tellurium content in the deposit may be varied from 21 to 75%.

EXAMPLE XI

System: Cobalt-Antimony
Composition: 18 to 72% antimony
Resistivity: 65 to 2000 microhm-cm
TCR: plus 100 to plus 800 ppm/°C
Plating Techniques:

| | | |
|---|---|---|
| Cobalt (fluoborate), $Co^{+2}(BF_4^-)$ | 3-90 | g/l |
| Antimony (fluoborate), $Sb^{+3}(BF_4^-)$ | 6-180 | g/l |
| Fluoboric acid, $HBF_4$ | 150-650 | g/l |
| Boric acid, $H_3BO_3$ | 0-50 | g/l |
| Current density | 1-25 | amp/dm² |
| Temperature | 20-80 | °C |
| pH | acid | |

By varying the antimony content in the bath from 7 to 99%, the antimony content in the deposit may be varied from 18 to 72%.

EXAMPLE XII

| | | |
|---|---|---|
| Plating Techniques: | | |
| Potassium antimonyl tartrate, $KSbC_4H_4O_7$ | 50-1000 | g/l |
| Cobalt (sulfate), $Co^{+2}(SO_4^{-2})$ | 6-60 | g/l |
| Rochelle salt $KNaC_4H_4O_6$ | 300-300 | g/l |
| Current density | 1-25 | amp/dm² |
| Temperature | 20-80 | °C |
| pH (by adding ammonia) $NH_4OH$ | 8-11 | |

By varying the antimony content in the bath from 23 to 98%, the antimony content in the deposit may be varied from 18 to 72%. In some cases, in order to obtain a non-crystalline deposit additives must be used in the bath. Their exact nature depends on the bath composition in use and the substrate for the deposit.

EXAMPLE XIII

System: Cobalt-Boron
Composition: 2 to 36% boron
Resistivity: 36 to 108 microhm-cm
TCR: minus 75 to plus 50 ppm/°C
Plating Techniques:

| | | |
|---|---|---|
| Sodium borohydride, $NaBH_4$ | 4-40 | g/l |
| Cobalt (chloride) $Co^{+2}(Cl^-)$ | 5-15 | g/l |
| Ammonium hydroxide $NH_4OH$ | 150-225 | g/l |
| Current density | 1-15 | amp/dm² |
| Temperature | 20-60 | °C |
| pH | 11-12.5 | |

By varying the boron content in the bath from 7 to 70%, the boron content in the deposit may be varied from 2 to 36%.

EXAMPLE XIV

| Plating Techniques: | | |
|---|---|---|
| Dimethyl amine borane, $(CH_3)_2NHBH_3$ | 5-100 | g/l |
| Sodium malonate, $CH_2(COONa)_2$ | 40-130 | g/l |
| Cobalt (sulfate), $CO^{+2}(SO_4^{-2})$ | 11-38 | g/l |
| Current density | 1-20 | amp/dm² |
| Temperature | 20-80 | °C |
| pH (by adding ammonia) | 5-5.6 | |

By varying the boron content in the bath from 3 to 68%, the boron content in the deposit may be varied from 2 to 36%.

In Examples XIII and XIV the cobalt and the complexing agent should be thoroughly mixed before the boron containing compound is added to the bath.

EXAMPLE XV

System: Cobalt-Germanium
Composition: 6 to 60% germanium
Resistivity: 34 to 321 microhm-cm
TCR: plus 100 to minus 50 ppm/°C

| Plating Techniques: | | |
|---|---|---|
| Germanium (oxide), $GeO_2$ | 0.15-15.0 | g/l |
| Cobalt (chloride), $Co^{+2}(Cl^-)$ | 0.1-10.0 | g/l |
| Ammonium chloride, $NH_4Cl$ | 25-30 | g/l |
| Ammonium oxalate, $(NH_4)_2C_2O_4$ | 30-40 | g/l |
| Sodium metabisulfite, $Na_2S_2O_5$ | 1-5 | g/l |
| Current density | 2-10 | amp/dm² |
| Temperature | 20-50 | °C |
| pH | alkaline | |

By varying the germanium content in the bath from 5 to 90%, the germanium content in the deposit may be varied from 6 to 60%.

EXAMPLE XVI

System: Cobalt-Indium
Composition: 18 to 71% indium
Resistivity: 65 to 335 microhm-cm
TCR: plus 100 to minus 50 ppm/°C

| Plating Techniques: | | |
|---|---|---|
| Indium (sulfate) $In^{+3}(SO_4^{-2})$ | 15-30 | g/l |
| Cobalt (sulfate), $Co^{+2}(SO_4^{-2})$ | 11-30 | g/l |
| Current density | 2-12 | amp/dm² |
| Temperature | 20-70 | °C |
| pH | 1-3 | |

By varying the cobalt and indium concentrations in the bath as well as the current density, the indium in the deposit may be varied from 60 to 71%.

EXAMPLE XVII

| Plating Techniques: | | |
|---|---|---|
| Indium (sulfate), $In^{+3}(SO_4^{-2})$ | 0.3-8 | g/l |
| Cobalt (sulfate), $Co^{+2}(SO_4^{-2})$ | 30-100 | g/l |
| Sulfamic acid, $H_2N \cdot SO_3H$ | 50 | g/l |
| Current density | 2-10 | amp/dm² |
| Temperature | 20-70 | °C |
| pH | 1-3 | |

As the weight of indium in the bath is increased from 0.3 to 100 g/l, the indium in the deposit rises from 18 to 71%.

EXAMPLE XVIII

System: Cobalt-Molybdenum
Composition: 10 to 65% molybdenum
Resistivity: 57 to 292 microhm-cm
TCR: plus 300 to plus 100 ppm/°C

| Plating Techniques: | | |
|---|---|---|
| Sodium molybdate, $Na_2MoO_4 \cdot 2H_2O$ | 5-17 | g/l |

EXAMPLE XVIII-Continued

| | | |
|---|---|---|
| Cobalt (carbonate), $Co^{+2}(CO_3^{-2})$ | 10 | g/l |
| Potassium carbonate, $K_2CO_3$ | 650 | g/l |
| Current density | 5-20 | amp/dm² |
| Temperature | 25-100 | °C |
| pH | 10.5-11.5 | |

By varying the molybdenum content in the bath from 30 to 85% the molybdenum content in the deposit may be varied from 15 to 35%.

EXAMPLE XIX

| Plating Techniques: | | |
|---|---|---|
| Sodium molybdate, $NaMoO_4 \cdot 2H_2O$ | 30-40 | g/l |
| Cobalt (carbonate), $Co^{-2}(CO_3^{-2})$ | 2-5 | g/l |
| Sodium bicarbonate, $NaHCO_3$ | 75-85 | g/l |
| Sodium pyrophosphate, $Na4P_2O_7$ | 60-80 | g/l |
| Hydrazine sulfate, $2N_2H4 \cdot H_{//2}SO_4$ | 1-3 | g/l |
| Current density | 5-20 | amp/dm² |
| Temperature | 20-75 | °C |
| pH | 7.5-9 | |

The hydrazine sulfate prevents undesirable reactions at the inert anode typically used in this bath. By varying the molybdenum content in the bath from 70 to 90%, the molybdenum content in the deposit may be varied from 45 to 55%.

EXAMPLE XX

| Plating Techniques: | | |
|---|---|---|
| Sodium molybdate, $NaMoO_4 \cdot 2H_2O$ | 3-50 | g/l |
| Cobalt (sulfate) $Co^{+2}(SO_4^{-2})$ | 6-50 | g/l |
| Sodium citrate $(NaOOC)_3C_3H_4OH$ | 30-300 | g/l |
| Current density | 1-20 | amp/dm² |
| Temperature | 25-70 | °C |
| pH (by addition of ammonia, $NH_4OH$; or sulfuric acid, $H_2SO_4$) | 3-5 or or 9-12 | |

This bath may be used at acid or alkaline pH values; in the midrange the current efficiency is undesirably low. The molybdenum content in the deposit may be varied from 10 to 65% by varying the molybdenum content in the bath from 3 to 77%.

Regarding the bath of Example XX in some instances it is advantageous to combine the sodium molybdate and sodium citrate in solution before adding them to the bath. These components are allowed to react until equilibrium is established and the resulting complex is added to the plating bath.

EXAMPLE XXI

System: Cobalt-Phosphorus
Composition: 6 to 52% phosphorus
Resistivity: 45 to 138 microhm-cm
TCR: minus 75 to plus 50 ppm/°C

| Plating Techniques: | | |
|---|---|---|
| Cobalt (carbonate), $Co^{+2}(CO_3^{-2})$ | 5-100 | g/l |
| Phosphorous acid, $H_3PO_3$ | 2-160 | g/l |
| Current density | 4-40 | amp/dm² |
| Temperature | 65-95 | °C |
| pH | 0.5-1 | |

By varying the phosphorus content in the bath from 1 to 54%, the phosphorus content in the deposit may be varied from 6 to 52%.

EXAMPLE XXII

| Plating Techniques: | | |
|---|---|---|
| Cobalt (chloride), $Co^{+2}(Cl^-)$ | 20-100 | g/l |

EXAMPLE XXII-Continued

| Plating Techniques: | | |
|---|---|---|
| Phosphoric acid, $H_3PO_4$ | 10–100 | g/l |
| Phosphorous acid, $H_3PO_3$ | 2–100 | g/l |
| Cobalt (carbonate) $Co^{+2}(CO_3^{-2}$ | 5–15 | g/l |
| Current density | 4–40 | g/l |
| Temperature | 65–95 | °C |
| pH | 0.5–1 | |

By varying the available phosphorus content (present in the bath as phosphorous acid) in the bath, the phosphorus content in the deposit may be varied from 6 to 52%.

Concerning baths of Example XXI and XXII, the quality and electrical characteristics of deposits from these baths may be improved by imposing an alternating current along with the direct current used in electroplating. The ratio of AC to DC may be varied from 2 to 1 up to 5 to 1.

EXAMPLE XXIII

System: Cobalt-Rhenium
Composition: 25 to 95% rhenium
Resistivity: 135 to 438 microhm-cm
TCR: plus 300 to plus 100 ppm/°C

| Plating Techniques | | |
|---|---|---|
| Potassium perrhenate, $KReO_4$ | 1–150 | g/l |
| Cobalt (sulfate), $Co^{+2}$ $(SO_4^{-2})$ | 2–25 | g/l |
| Citric Acid, $HOC_3H_4(COOH)_3$ | 20–200 | g/l |
| Current density | 2–12 | amp/dm² |
| Temperature | 25–90 | °C |
| pH (by addition of ammonia $NH_4OH$; or sulfuric acid $H_2SO_4$) | 3–8 | |

By varing the rhenium content in the bath from 3 to 80%, the rhenium content in the deposit may be varied from 25 to 95%.

EXAMPLE XXIV

System: Cobalt-Ruthenium
Composition: 16 to 94% ruthenium
Resistivity: 245 to 680 microhm-cm
TCR: plus 100 to minus 50 ppm/°C

| Plating Techniques: | | |
|---|---|---|
| Ruthenium(chloride) $Ru^{+3}(Cl^-)$ | 0.1–50 | g/l |
| Cobalt (chloride), $Co^{+2}(Cl^-)$ | 2–50 | g/l |
| Ammonium chloride, $NH_4Cl$ | 50–120 | g/l |
| Potassium chloride, KCl | 3–5 | g/l |
| Hydrogen peroxide, $H_2O_2$ | 1–2 | g/l |
| Current density | 4–10 | amp/dm² |
| Temperature | 20–50 | °C |
| pH (by addition of HCl) | 1–3 | |

By varying the ruthenium content in the bath from 0.5 to 96%, the ruthenium content in the deposit may be varied from 16 to 94%.

EXAMPLE XXV

System: Cobalt-Tungsten
Composition: 15 to 72% tungsten
Resistivity: 37 to 236 microhm-cm
TCR: plus 300 to plus 100 ppm/°C

| Plating Techniques: | | |
|---|---|---|
| Sodium tungstate, $Na_2WO_4{\cdot}2H_2O$ | 10–100 | g/l |
| Cobalt (sulfate or chloride), $Co^{+2}(SO_4^{-2}$ or $Cl^-)$ | 0.85–40 | g/l |
| Citric acid, $HOC_3H_4(COOH)_3$ | 20–200 | g/l |
| Ammonium chloride, $NH_4Cl$ | 0–50 | g/l |
| Hydrazine sulfate, $2N_2H_4{\cdot}H_2SO_4$ | 0–10 | g/l |
| Current density | 2–20 | amp/dm² |
| Temperature | 50–90 | °C |
| pH (by adding ammonia, $NH_4OH$) | 6.4–9.8 | |

By varying the tungsten content in the bath from 12 to 98%, the tungsten content in the deposit may be varied from 15 to 72%.

EXAMPLE XXVI

| Plating Techniques: | | |
|---|---|---|
| Sodium tungstate, $Na_2WO_4.2H_2O$ | 15–40 | g/l |
| Cobalt (sulfate), $Co^{+2}(SO_4^{-2})$ | 2–5 | g/l |
| Ammonium sulfate $(NH_4)_2SO_4$ | 60–330 | g/l |
| Ammonium hydroxide, $NH_4OH$ | 35–75 | g/l |
| Sodium hydroxide, NaOH | 8–12 | g/l |
| Current density | 1–40 | amp/dm² |
| Temperature | 20–75 | °C |
| pH | 9–11.5 | |

By varying the tungsten content in the bath from 57 to 92%, the tungsten content in the deposit may be varied from 20 to 57%. It is possible to improve the quality and electrical properties of the deposit by superimposing an alternating current on the direct current employed in the electrodeposition. The ratio of AC to DC may be varied from 2:1 to 10:1.

EXAMPLE XXVII

System: Cobalt-Vanadium
Composition: 9 to 70% vanadium
Resistivity: 48 to 148 microhm-cm
TCR: minus 75 to plus 50 ppm/°C

| Plating Techniques: | | |
|---|---|---|
| Vanadyl sulfate trihydrate, $VOSO_4.3H_2O$ | 7–85 | g/l |
| Cobalt (sulfate), $Co^{+2}(SO_4^{-2})$ | 7–15 | g/l |
| Boric acid, $H_3BO_3$ | 25–30 | g/l |
| Current density | 1–10 | amp/dm² |
| Temperature | 18–80 | °C |
| pH | 1–6 | |

By varying the vanadium content in the bath from 10 to 74%, the vanadium content in the deposit may be varied from 9 to 70%.

EXAMPLE XXVIII

| Plating Techniques: | | |
|---|---|---|
| Sodium metavanadate, $NaVO_3$ | 5–50 | g/l |
| Cobalt (chloride), $Co^{+2}(Cl^-)$ | 10–20 | g/l |
| Sodium citrate, $HOC_3H_4(COONa)_3$ | 50–100 | g/l |
| Sodium hypophosphite, $NaH_2PO_2$ | 20–40 | g/l |
| Sodium oxalate dihydrate, $Na_2C_2O_4 . 2H_2O$ | 20–100 | g/l |
| Current density | 1–15 | amp/dm² |
| Temperature | 20–80 | °C |
| pH | alkaline | |

By varying the vanadium content in the bath from 9 to 67%, the vanadium content in the deposit may be varied from 9 to 70%.

EXAMPLE XXIX

System: Iron-Vanadium
Composition: 9 to 65% vanadium
Resistivity: 40 to 217 microhm-cm
TCR: minus 75 to plus 50 ppm/°C

| Plating Techniques: | | |
|---|---|---|
| Vanadium (chloride), $V^{+3}(Cl^-)$ | 5–40 | g/l |
| Iron (chloride), $Fe^{+3}(Cl^-)$ | 15–25 | g/l |
| Hydrochloric or sulfuric acid, HCl or $H_2SO4$ | 0.1 | Normal |
| Current density | 1–15 | amp/dm² |
| Temperature | 20–80 | °C |
| pH | 1.0–1.5 | |

By varying the vanadium content in the bath from 17 to 70%, the vanadium content in the deposit may be varied from 9 to 65%.

EXAMPLE XXX

Plating Techniques:

| | | |
|---|---|---|
| Sodium metavanadate, $NaVO_3$ | 5–20 | g/l |
| Iron (fluoride), $Fe^{+2}(F^-)$ | 6.6 | g/l |
| Iron (chloride), $Fe^{+2}(Cl^-)$ | 0.21 | g/l |
| Sodium acetate, $NaOOCCH_3$ | 10 | g/l |
| Sodium hypophosphite, $NaH_2PO_2$ | 10 | g/l |
| Potassium oxalate, monohydrate $K_2C_2O_4.H_2O$ | 50 | g/l |
| Current density | 1–15 | amp/dm² |
| Temperature | 75–90 | °C |
| pH | 4–6 | |

By varying the vanadium content in the bath from 27 to 54% the vanadium content in the deposit may be varied from 20 to 50%.

EXAMPLE XXXI

System: Nickel-Antimony
Composition: 15 to 74% antimony
Resistivity: 50 to 1800 microhm-cm
TCR: plus 100 to plus 800 ppm/°C
Plating Techniques:

| | | |
|---|---|---|
| Nickel (fluoborate), $Ni^{+2}(BF_4^-)$ | 2.95–88.5 | g/l |
| Antimony (fluoborate), $Sb^{+3}(BF_4^-)$ | 6.1–183 | g/l |
| Fluoboric acid (free), $HBF_4$ | 150–650 | g/l |
| Boric acid, $H_3BO_3$ | 0–50 | g/l |
| Current density | 1–25 | amp/dm² |
| Temperature | 20–80 | °C |
| pH | acid | |

By varying the antimony content in the bath from 6.5 to 98.5%, the antimony content in the deposit may be varied from 15 to 74%.

EXAMPLE XXXII

Plating Techniques:

| | | |
|---|---|---|
| Potassium antimonyl tartrate, $KSbC_4H_4O_7$ | 50–1000 | g/l |
| Nickel (sulfate), $Ni^{+2}(SO_4^{-2})$ | 6–60 | g/l |
| Rochelle salt, $KNaC_4H_4O_6$ | 30–300 | g/l |
| Current density | 1–25 | g/l |
| Temperature | 20–80 | °C |
| pH(by adding ammonia, $NH_4OH$) | 8–11 | |

By varying the antimony content in the bath from 23 to 98%, the antimony content in the deposit may be varied from 15 to 74%. Concerning the baths in Examples XXXI and XXXII; in some cases, in order to obtain a non-crystalline deposit, additives must be used in the bath. Their exact nature depends on the bath composition in use and the substrate for the deposit.

EXAMPLE XXXIII

System: Nickel-Boron
Composition: 2 to 36% boron
Resistivity: 34 to 100 microhm-cm
TCR: minus 75 to plus 50 ppm/°C
Plating Techniques:

| | | |
|---|---|---|
| Sodium borohydride, $NaBH_4$ | 4–40 | g/l |
| Nickel (chloride), $Ni^{+2}(Cl^-)$ | 5–15 | g/l |
| Ammonium hydroxide, $NH_4OH$ | 150–225 | g/l |
| Current density | 1–15 | amp/dm² |
| Temperature | 20–60 | °C |
| pH | 11–12.5 | |

By varying the boron content in the bath from 7 to 70%, the boron content may be varied from 2 to 36%.

EXAMPLE XXXIV

Plating Techniques:

| | | |
|---|---|---|
| Dimethyl amine borane$(CH_3)_2NHBH_3$ | 5–100 | g/l |
| Sodium malonate, $CH_2(COO\ Na)_2$ | 40–130 | g/l |
| Nickel (sulfate), $Na^{+2}(SO_4^{-2})$ | 11–38 | g/l |
| Current density | 1–20 | amp/dm² |
| Temperature | 20–80 | °C |
| pH (by adding ammonia) | 5–6.5 | |

By varying the boron content in the bath from 3 to 68%, the boron content in the deposit may be varied from 2 to 36%.

Concerning the baths of Examples XXXIII and XXXIV, the nickel compound and the complexing agent should be thoroughly mixed before the boron containing compound is added to the bath.

EXAMPLE XXXV

System: Nickel-Chromium
Composition: 9 to 40% chromium
Resistivity: 54 to 162 microhm-cm
TCR: plus 150 to plus 50 ppm/°C
Plating Techniques:

| | | |
|---|---|---|
| Chromium (fluoborate), $Cr^{+3}(BF_4^-)$ | 10–80 | g/l |
| Nickel (fluoborate), $Ni^{+2}(BF_4^-)$ | 4–52 | g/l |
| Fluoboric acid (free), $HBF_4$ | 150–650 | g/l |
| Current density | 1–90 | amp/dm² |
| Temperature | 20–80 | °C |
| pH | acid | |

By varying the chromium content in the solution from 16 to 95% the chromium content in the deposit may be varied from 9 to 40%.

EXAMPLE XXXVI

| | | |
|---|---|---|
| Potassium chromium sulfate, $KCr(SO_4^{-2})_2$ | 400–450 | g/l |
| Nickel (formate), $Ni(CHO_2)_2$ | 30–40 | g/l |
| Sodium citrate, $HOC_3H_4(COONa)_3$ | 50–100 | g/l |
| Boric acid, $H_3BO_3$ | 30–50 | g/l |
| Sodium fluoride, NaF | 8–13 | g/l |
| Glycine, $CH_2(NH_2)COOH$ | 10–25 | g/l |
| Current density | 3–35 | amp/dm² |
| Temperature | 20–60 | °C |
| pH | 1–3 | |

By varying the chromium content in the bath from 65 to 73%, the chromium content in the deposit may be varied from 9 to 40%.

EXAMPLE XXXVII

System: Nickel-Germanium
Composition: 6 to 60% germanium
Resistivity: 31 to 278 microhm-cm
TCR: plus 100 to minus 50 ppm/°C
Plating Techniques:

| | | |
|---|---|---|
| Germanium (oxide), $GeO_2$ | 0.15–15.0 | g/l |
| Nickel (sulfate), $Ni^{+2}(SO_4^{-2})$ | 0.1–9.0 | g/l |
| Ammonium sulfate, $(NH_4)_2SO_4$ | 25–30 | g/l |
| Ammonium oxalate,$(NH_4)_2C_2O_4$ | 30–40 | g/l |
| Aqua ammonia, $NH_4OH$ | 38–46 | g/l |
| Current density | 2–10 | amp/dm² |
| Temperature | 20–50 | °C |
| pH | alkaline | |

By varying the germanium content in the bath from 5 to 80%, the germanium content in the deposit may be varied from 6 to 60%.

EXAMPLE XXXVIII

System: Nickel-Indium
Composition: 18 to 71% indium

EXAMPLE XXXVIII-Continued

Resistivity: 61 to 308 microhm-cm
TCR: plus 100 to minus 50 ppm/°C
Plating Techniques:

| | | |
|---|---|---|
| Indium (sulfate), $In^{+3}(SO_4^{-2})$ | 0.8–7.0 | g/l |
| Nickel (sulfate), $Ni^{+2}(SO_4^{-2})$ | 100 | g/l |
| Sulfamic acid, $(HSO_3.NH_2)$ | 50 | g/l |
| Current density | 2–10 | amp/dm² |
| Temperature | 20–70 | °C |
| pH | acid | |

As the weight of indium in the bath is increased from 0.8 to 7.9 g/l, the indium content in the deposit rises from 18 to 60%.

EXAMPLE XXXIX

Plating Techniques:

| | | |
|---|---|---|
| Indium (sulfate), $In^{+3}(SO_4^{-2})$ | 0.3–8.0 | g/l |
| Nickel (sulfate), $Ni^{+2}(SO_4^{-2})$ | 30 | g/l |
| Boric acid $H_3BO_3$ | 30 | g/l |
| Current density | 2–12 | amp/dm² |
| Temperature | 20–70 | °C |
| pH | 1–3 | |

By varying the indium content in the bath and the current density the indium content in the deposit may be varied from 18 to 71%.

EXAMPLE XL

Plating Techniques:

| | | |
|---|---|---|
| Indium (sulfate), $In^{+3}(SO_4^{-2})$ | 15–30 | g/l |
| Nickel (sulfate), $Ni^{+2}(SO_4^{-2})$ | 11–27 | g/l |
| Current density | 2–12 | amp/dm² |
| Temperature | 20–70 | °C |
| pH | 1–3 | |

By varying the weights of indium and nickel in the bath, and by varying the current density, the indium content in the deposit may be varied from 60 to 71%.

EXAMPLE XLI

System: Nickel-Molybdenum
Composition: 10 to 65% molybdenum
Resistivity: 50 to 206 microhm-cm
TCR: plus 300 to plus 100 ppm/°C
Plating Techniques

| | | |
|---|---|---|
| Sodium molybdate, $Na_2MoO_4 \cdot 2H_2O$ | 24–120 | g/l |
| Nickel (chloride), $Ni^{+2}(Cl^-)$ | 2.5–3.5 | g/l |
| Sodium pyrophosphate, $Na_4P_2O_7$ | 25–215 | g/l |
| Sodium bicarbonate, $NaHCO_3$ | 70–100 | g/l |
| Hydrazine sulfate, $N_2H_4.H_2SO_4$ | 0–4 | g/l |
| Current density | 2–25 | amp/dm² |
| Temperature | 25–70 | °C |
| pH | 8–10 | |

By varying the molybdenum content in the bath from 70 to 95% the molybdenum content in the deposit may be varied from 10 to 45%.

EXAMPLE XLII

Plating Techniques

| | | |
|---|---|---|
| Sodium molybdate, $Na_2MoO_4.2H_2O$ | 5–75 | g/l |
| Nickel (chloride), $Ni^{+2}(Cl^-)$ | 5–30 | g/l |
| Sodium citrate, $HoC_3H_4(COONa)_3$ | 30–130 | g/l |
| Potassium chloride, KCl | 0–75 | g/l |
| Current density | 2–22 | amp/dm² |
| Temperature | 25–70 | °C |
| pH (by adding hydrochloric acid, HCl; or ammonia, $NH_4OH$) | 3–6 or 8–11.5 | |

This bath may be used at acid or alkaline pH values; in the midrange the current efficiency is undesirably low. The molybdenum content in the deposit may be varied from 10 to 65% by varying the molybdenum content in the bath from 6 to 85%. In some instances it is advantageous to combine the sodium molybdate and sodium citrate in solution before adding them to the bath. These components are allowed to react until equilibrium is established and the resulting complex is added to the plating bath.

EXAMPLE XLIII

System: Nickel-Phosphorus
Composition: 5 to 50% phosphorus
Resistivity: 39 to 115 microhm-cm
TCR: minus 75 to plus 50 ppm/°C
Plating Techniques

| | | |
|---|---|---|
| Nickel (sulfate), $Ni^{+2}(SO_4^{-2})$ | 30–40 | g/l |
| Nickel (chloride), $Ni^{+2}(Cl^-)$ | 10–15 | g/l |
| Nickel (carbonate), $Ni^{+2}(CO_3^{-2})$ | 5–15 | g/l |
| Phosphoric acid, $H_3PO_4$ | 50–160 | g/l |
| Phosphorous acid, $H_3PO_3$ | 2–140 | g/l |
| Current density | 5–40 | amp/dm² |
| Temperature | 65–100 | °C |
| pH | 0.5–1 | |

By varying the available phosphorus content in the bath (phosphorus in phosphorous acid) from 1 to 53%, the phosphorus content in the deposit may be varied from 5 to 50%.

EXAMPLE XLIV

Plating Techniques

| | | |
|---|---|---|
| Nickel (carbonate), $Ni^{+2}(CO_3^{-2})$ | 60 | g/l |
| Phosphorous acid, $H_3PO_3$ | 10–170 | g/l |
| Current density | 5–40 | amp/dm² |
| Temperature | 75–95 | °C |
| pH | 0.5–1 | |

By varying the phosphorus content in the bath from 6 to 55%, the phosphorus content in the deposit may be varied from 5 to 50%.

EXAMPLE XLV

System: Nickel-Rhenium
Composition: 75 to 95 % rhenium
Resistivity: 229 to 106 microhm-cm
TCR: plus 100 to plus 300 ppm/°C
Plating Techniques:

| | | |
|---|---|---|
| Potassium perrhenate, $KReO_4$ | 5–250 | g/l |
| Nickel (sulfate), $Ni^{+}2(SO_4^{-}{}_2)$ | 10–50 | g/l |
| Nickel (chloride), $Ni^{+}2(Cl^-)$ | 0–12 | g/l |
| Boric acid, $H_3BO_3$ | 0–30 | g/l |
| Citric acid, $HOC_3H_4(COOH)_3$ | 20–200 | g/l |
| Current density | 2–15 | amp/dm² |
| Temperature | 25–90 | °C |
| pH (by addition of ammonia, $NH_4OH$, or sulfuric acid, $H_2SO_4$) | 2–8 | |

By varying the rhenium content in the bath from 6 to 98%, the rhenium content in the deposit may be varied from 75 to 95%.

EXAMPLE XLVI

System: Nickel-Vanadium
Composition: 9 to 72% vanadium
Resistivity: 41 to 122 microhm-cm
TCR: minus 75 to plus 50 ppm/°C
Plating Techniques:

| | | |
|---|---|---|
| Vanadyl sulfate trihydrate, $VOSO_4.3H_2O$ | 7–85 | g/l |
| Nickel (sulfate), $Ni^{+2}(SO_4^{-2})$ | 7–15 | g/l |
| Boric acid, $H_3BO_3$ | 25–30 | g/l |
| Current density | 1–10 | amp/dm² |
| Temperature | 18–80 | °C |
| pH | 1–6 | |

By varying the vandium content in the bath from 10 to 74%, the vanadium content in the deposit may be varied from 9 to 70%.

EXAMPLE XLVII

| | | |
|---|---|---|
| Plating Techniques: | | |
| Sodium metavanadate, $NaVO_3$ | 5–20 | g/l |
| Nickel (sulfate), $Ni^{+2}(SO_4^{-2})$ | 6.7 | g/l |
| Sodium acetate, $NaOOCCH_3$ | 10 | g/l |
| Sodium hypophosphite, $NaH_2PO_2$ | 10 | g/l |
| Potassium oxalate, $K_2C_2O_4.H_2O$ | 50 | g/l |
| Current density | 1–15 | amp/dm² |
| Temperature | 75–90 | °C |
| pH | 4–6 | |

By varying the vanadium content of the bath from 24 to 55% the vanadium content of the deposit may be varied from 9 to 70%.

EXAMPLE XLVIII

| | | |
|---|---|---|
| System: Palladium-Molybdenum | | |
| Composition: 9 to 40% molybdenum | | |
| Resistivity: 78 to 228 microhm-cm | | |
| TCR: plus 300 to plus 100 ppm/°C | | |
| Plating Techniques: | | |
| Sodium molybdate, $Na_2MoO_4.2H_2O$ | 24–120 | g/l |
| Palladium (chloride), $Pd^{+2}(Cl^-)$ | 4–7 | g/l |
| Sodium pyrophosphate, $Na_4P_2O_7$ | 25–215 | g/l |
| Sodium bicarbonate, $NaHCO_3$ | 70–100 | g/l |
| Hydrazine sulfate, $N_2H_4.H_2SO_4$ | 0–4 | g/l |
| Current density | 2–25 | amp/dm² |
| Temperature | 25–75 | °C |
| pH | 8–10 | |

By varying the molybdenum content in the bath from 58 to 92%, the molybdenum content in the deposit may be varied from 9 to 40%.

EXAMPLE XLIX

| | | |
|---|---|---|
| Plating Techniques: | | |
| Sodium molybdate, $Na_2MoO_4 . 2H_2O$ | 5–13 | g/l |
| Palladium (chloride), $Pd^{+2}(Cl^-)$ | 20–100 | g/l |
| Ammonium chloride, $NH_4Cl$ | 4–45 | g/l |
| Ammonia $NH_3$ | 60–200 | g/l |
| Current density | 2–15 | amp/dm² |
| Temperature | 25–45 | °C |
| pH | 8–11.5 | |

By varying the molybdenum content in the bath from 2 to 20%, the molybdenum content in the deposit may be varied from 9 to 30%.

EXAMPLE L

| | | |
|---|---|---|
| Plating Techniques: | | |
| Sodium molybdate, $Na_2MoO_4.2H_2O$ | 5–57 | g/l |
| Palladium (chloride), $Pd^{+2}(Cl^-)$ | 10–60 | g/l |
| Sodium citrate, $HOC_3H_4(COONa)_3$ | 30–130 | g/l |
| Potassium chloride, KCl | 0–75 | g/l |
| Current density | 2–22 | amp/dm² |
| Temperature | 25–70 | °C |
| pH | 3–6 or 8–11.5 | |

By varying the molybdenum content in the bath from 3 to 70%, the molybdenum content in the deposit may be varied from 9 to 40%.

The highly conductive layer of stock preferably consists of a pre-formed metal foil such as copper foil, tinn5d copper foil, aluminum foil, zinc foil or silver foil. Any convenient foil thickness may be used, for instance 0.002 inch.

The insulating support may be any of the materials known to those skilled in the art. For example, the support may be a polyimide such as those based on organic diamines and dicarboxylic or tetracarboxylic acids. The epoxy resins based on the polyglycidyl ethers of organic polyphenols are also preferred. These resinous supports may contain any of the familiar reinforcing materials such as fiberglass fabric. The support can also be phenolic resinimpregnated paper, melamine resin-impregnated paper, polyimide resin-impregnated fiberglass fabric, or polyester resin containing chopped glass reinforcement. It frequently is desirable to include a layer of highly thermally conductive material in the laminate construction. The layer may be laminated to the side opposite the resistive cladding or within the several plies of preimpregnated reinforcement. The purpose of the thermally conductive layer is to provide a heat transfer mechanism for the moderation of electrical heating effects of resistors formed on the laminate surface. Aluminum and copper foils have been found suitable for this purpose.

Having fully described the invention it is intended that it be limited only by the lawful scope of the appended claims.

I claim:

1. A novel printed circuit board material in the form of a layered stock comprising an insulating support, at least one layer of electrical resistance material adhering to said support, and a layer of a highly conductive material adhering to the resistance material and in intimate contact therewith, said layer of electrical resistance material being selected from the group consisting of chromium-antimony containing from about 13 – 74% by weight antimony, chromium-manganese containing from about 10–80% by weight manganese, chromium-phosphorus containing from about 6–52% by weight phosphorus, chromium-selenium containing from about 14–65% by weight selenium, chromium-tellurium containing from about 21–75% by weight tellurium, cobalt-antimony containing from about 18–72% by weight antimony, cobalt-boron containing from about 2–36% by weight boron, cobalt-germanium containing from about 6–60% germanium, cobalt-indium containing from about 18–71% by weight indium, cobalt-molybdenum containing from about 10–65% by weight molybdenum, cobalt-phosphorus containing from about 6–52% by weight phosphorus, cobalt-rhenium containing from about 25–95% by weight rhenium, cobalt-ruthenium containing from about 16–94% by weight ruthenium, cobalt-tungsten containing from about 15–72% by weight tungsten, cobalt-vanadium containing from about 9–70% by weight vanadium, iron-vanadium containing from about 9–65% by weight vanadium, nickel-antimony containing from about 15–74% by weight antimony, nickel-boron containing from about 2–36% by weight boron, nickel-chromium containing from about 9–40% by weight chromium, nickel-germanium containing from about 6–60% by weight germanium, nickel-indium containing from about 18–71% by weight indium, nickel-molybdenum containing from about 10–65% by weight molybdenum, nickel-phosphorus containing from about 5–50% by weight phosphorus, nickel-rhenium containing from about 75–95% by weight rhenium, nickel-vanadium containing from about 9–72% by weight vanadium, and palladium-molybdenum containing from about 9–40% by weight molybdenum.

2. The novel printed circuit board material of claim 1 wherein the conductive layer comprises copper foil.

3. The novel printed circuit board material of claim 1 wherein the conductive layer comprises aluminum foil.

4. The novel printed circuit board material of claim 1 wherein the support comprises a reinforced organic resin.

5. The novel printed circuit board material of claim 1 wherein the support comprises a fiberglass fabric reinforced epoxy resin.

6. The novel printed circuit board material of claim 1 wherein the support comprises a fiberglass fabric reinforced polyimide resin.

7. The novel printed circuit board material of claim 1 wherein the support comprises a reinforced organic resin in which or to which is bonded a thermally conductive layer.

8. The novel printed circuit board material of claim 1 wherein the resistive material is chromium-antimony containing from about 13 to 74% by weight antimony.

9. The novel printed circuit board material of claim 1 wherein the resistive material is chromium-manganese containing from about 10 –80% by weight manganese.

10. The novel printed circuit board material of claim 1 wherein the resistive material is chromium-phosphorus containing from about 6 – 52% by weight phosphorus.

11. The novel printed circuit board material of claim 1 wherein the resistive material is chromium-selenium containing from about 14 – 65% by weight selenium.

12. The novel printed circuit board material of claim 1 wherein the resistive material is chromium-tellurium containing from about 21 – 75% by weight tellurium.

13. The novel printed circuit board material of claim 1 wherein the resistive material is cobalt-antimony containing from about 18 – 72% by weight antimony.

14. The novel printed circuit board material of claim 1 wherein the resistive material is cobalt-boron containing from about 2 – 36% by weight boron.

15. The novel printed circuit board material of claim 1 wherein the resistive material is cobalt-germanium containing from about 6 – 60% by weight germanium.

16. The novel printed circuit board material of claim 1 wherein the resistive material is cobalt-indium containing from about 18 – 71% by weight indium.

17. The novel printed circuit board material of claim 1 wherein the resistive material is cobalt-molybdenum containing from about 10 – 65% by weight molybdenum.

18. The novel printed circuit board material of claim 1 wherein the resistive material is cobalt-phosphorus containing from about 6 – 52% by weight phosphorus.

19. The novel printed circuit board material of claim 1 wherein the resistive material is cobalt-rhenium containing from about 25 – 95% by weight rhenium.

20. The novel printed circuit board material of claim 1 wherein the resistive material is cobalt-ruthenium containing from about 16 – 94% by weight ruthenium.

21. The novel printed circuit board material of claim 1 wherein the resistive material is cobalt-tungsten containing from about 15 – 72% by weight tungsten.

22. The novel printed circuit board material of claim 1 wherein the resistive material is cobalt-vanadium containing from about 9 – 70% by weight vanadium.

23. The novel printed circuit board material of claim 1 wherein the resistive material is iron-vanadium containing from about 9 – 65% by weight vanadium.

24. The novel printed circuit board material of claim 1 wherein the resistive material is nickel-antimony containing from about 15 – 74% by weight antimony.

25. The novel printed circuit board material of claim 1 wherein the resistive material is nickel-boron containing from about 2 – 36% by weight boron.

26. The novel printed circuit board material of claim 1 wherein the resistive material is nickel-chromium containing from about 9 – 40% by weight chromium.

27. The novel printed circuit board material of claim 1 wherein the resistive material is nickel-germanium containing from about 6 – 60% by weight germanium.

28. The novel printed circuit board material of claim 1 wherein the resistive material is nickel-indium containing from about 18 – 71% by weight indium.

29. The novel printed circuit board material of claim 1 wherein the resistive material is nickel-molybdenum containing from about 10 – 65% by weight molybdenum.

30. The novel printed circuit board material of claim 1 wherein the resistive material is nickel-phosphorus containing from about 5 – 50 % by weight phosphorus.

31. The novel printed circuit board material of claim 1 wherein the resistive material is nickel-rhenium containing from about 75 – 95% by weight rhenium.

32. The novel printed circuit board material of claim 1 wherein the resistive material is nickel-vanadium containing from about 9 – 72% by weight vanadium.

33. The novel printed circuit board material of claim 1 wherein the resistive material is palladium-molybdenum containing from about 9 – 40% by weight molybdenum.

* * * * *